United States Patent [19]

Brady et al.

[11] 4,075,302

[45] Feb. 21, 1978

[54] APPARATUS FOR GRIPPING AND HOLDING SMALL WORKPIECES

[75] Inventors: John K. Brady; Robert Noyes, both of Champaign, Ill.

[73] Assignee: University of Illinois Foundation, Urbana, Ill.

[21] Appl. No.: 805,920

[22] Filed: June 13, 1977

[51] Int. Cl.² .............................................. B25B 1/10
[52] U.S. Cl. ..................................... 269/43; 118/500; 269/243; 269/275; 269/309; 269/321 W
[58] Field of Search ............... 269/43, 44, 254 R, 265, 269/274, 275, 277, 289 R, 309; 118/500–503

[56] References Cited

U.S. PATENT DOCUMENTS

| 1,085,871 | 2/1914 | Mendelssohn | 269/43 |
| 3,312,460 | 4/1967 | Kaufman | 269/43 X |

FOREIGN PATENT DOCUMENTS 538,132  7/1941  United Kingdom ................... 269/43

Primary Examiner—Robert C. Watson
Attorney, Agent, or Firm—Martin Novack

[57] ABSTRACT

The invention is directed to an apparatus for gripping and holding a plurality of relatively small flat chips, such as electron microscope grids, by the edges thereof. An elevated support member is provided, the support member having a top surface which defines a table and having an aperture therein. A support flange extends inwardly from the aperture a predetermined distance below the table surface. A gripping assembly is removably mountable in the aperture in the support member. The gripping assembly includes a first gripping member having a periphery corresponding to the contour of the aperture and having a thickness at its periphery which corresponds to the predetermined distance. A second gripping member opposes the first gripping member. At least a portion of the periphery of the second gripping member has a contour that corresponds to the periphery of the first gripping member. A resilient spacing means is disposed between the first and second gripping members and is operative to normally bias the peripheries of the gripping members slightly apart. Means are provided for temporarily squeezing the gripping members together. In operation, the gripping assembly is mounted in the support member and seated on the flange. Chips placed on the table surface can be manually moved to positions where their edges are between the spaced peripheries of the gripping members, whereupon activation of the squeezing means causes gripping and holding of the chip edges by the gripping assembly.

5 Claims, 6 Drawing Figures

APPARATUS FOR GRIPPING AND HOLDING SMALL WORKPIECES

BACKGROUND OF THE INVENTION

This invention relates to the gripping and treating of small workpieces and, more particularly, to an apparatus for gripping and holding a plurality of relatively small flat chips, such as electron microscope grids, for the purpose of treating or staining the chips.

In various applications, it is necessary to handle very small flat chips of material so as to treat a surface thereof. Individual handling of such items is often difficult or interferes with the desired treatment. For example, electron microscope grids are typically small thin discs, and the staining thereof can be difficult due to their small size.

It is an object of the present invention to provide an apparatus which efficiently grips and holds, under operator control, a relatively large number of small flat chips, by the edges thereof, so that any desired kind of treatment can be effected.

SUMMARY OF THE INVENTION

The present invention is directed to an apparatus for gripping and holding a plurality of relatively small flat chips, such as electron microscope grids, by the edges thereof. An elevated support member is provided, the support member having a top surface which defines a table and having an aperture therein. A support flange extends inwardly from the aperture a predetermined distance below the table surface. A gripping assembly is removably mountable in the aperture in the support member. The gripping assembly includes a first gripping member having a periphery corresponding to the contour of the aperture and having a thickness at its periphery which corresponds to the predetermined distance. A second gripping member opposes the first gripping member. At least a portion of the periphery of the second gripping member has a contour that corresponds to the periphery of the first gripping member. A resilient spacing means is disposed between the first and second gripping members and is operative to normally bias the peripheries of the gripping members slightly apart. Finally, means are provided for temporarily squeezing the gripping members together. In operation, the gripping assembly is mounted in the support member and seated on the flange. Chips placed on the table surface can be manually moved to positions where their edges are between the spaced peripheries of the gripping members, whereupon activation of the squeezing means causes gripping and holding of the chip edges by the gripping assembly.

In the preferred embodiment of the invention, one of the gripping members of each pair has a stop abutment spaced from the edge thereof to define a maximum penetration of the chips between the gripping members, and the other of the gripping members has a recess proportioned to receive the stop abutment. Also, in this embodiment, the gripping members are cylindrical in shape and have central bores therethrough. The means for temporarily squeezing the gripping members together comprises a central shaft through the bores, the shaft having threading thereon, and threaded nut means which engage the shaft and can be tightened thereon to squeeze the gripping members together. Also, in the preferred form of the invention, to be described, four gripping members are utilized to form three individually controllable gripping slots.

Further features and advantages of the invention will become more readily apparent from the following detailed description when taken in conjunction with the accompanying drawings.

DESCRIPTION OF THE PREFERRED EMBODIMENT

Figure 1:
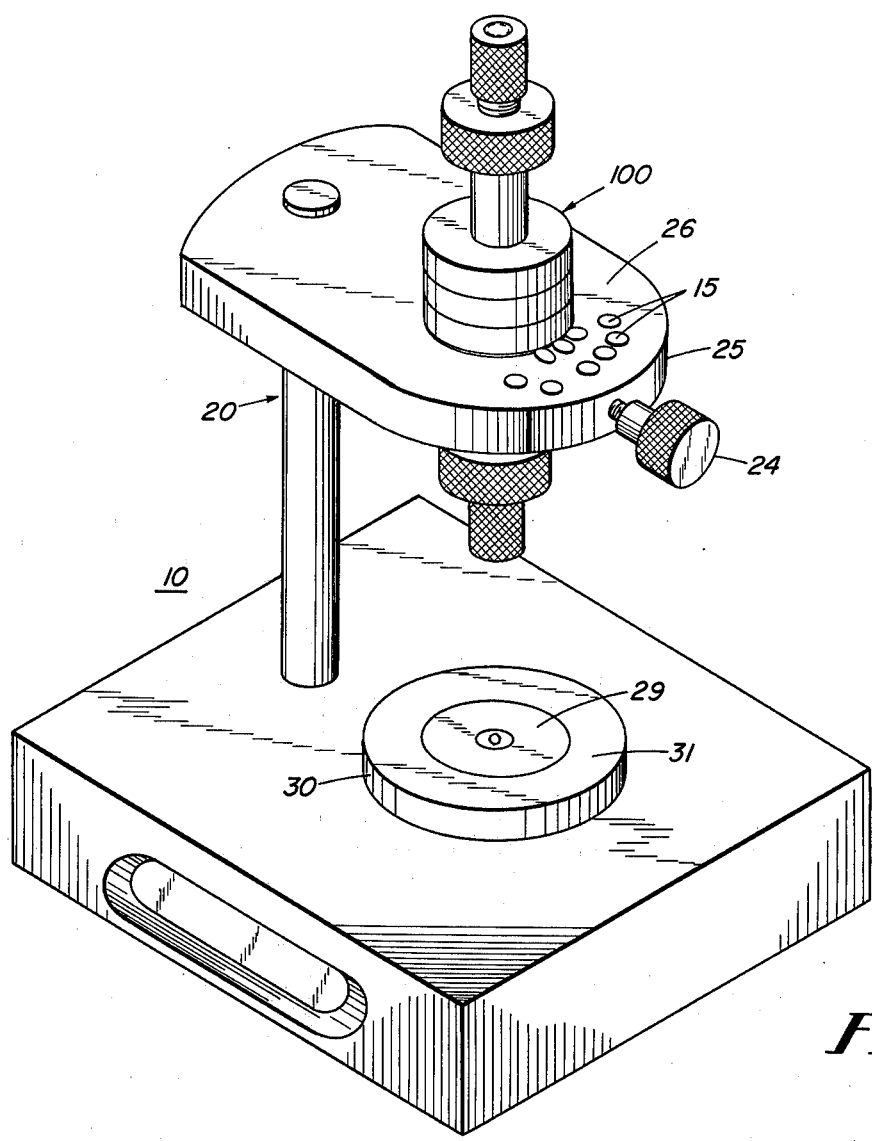
FIG. 1 is an elevational perspective view illustrating operation of the gripping assembly of the invention mounted in the support stand of the invention.
Figure 2:
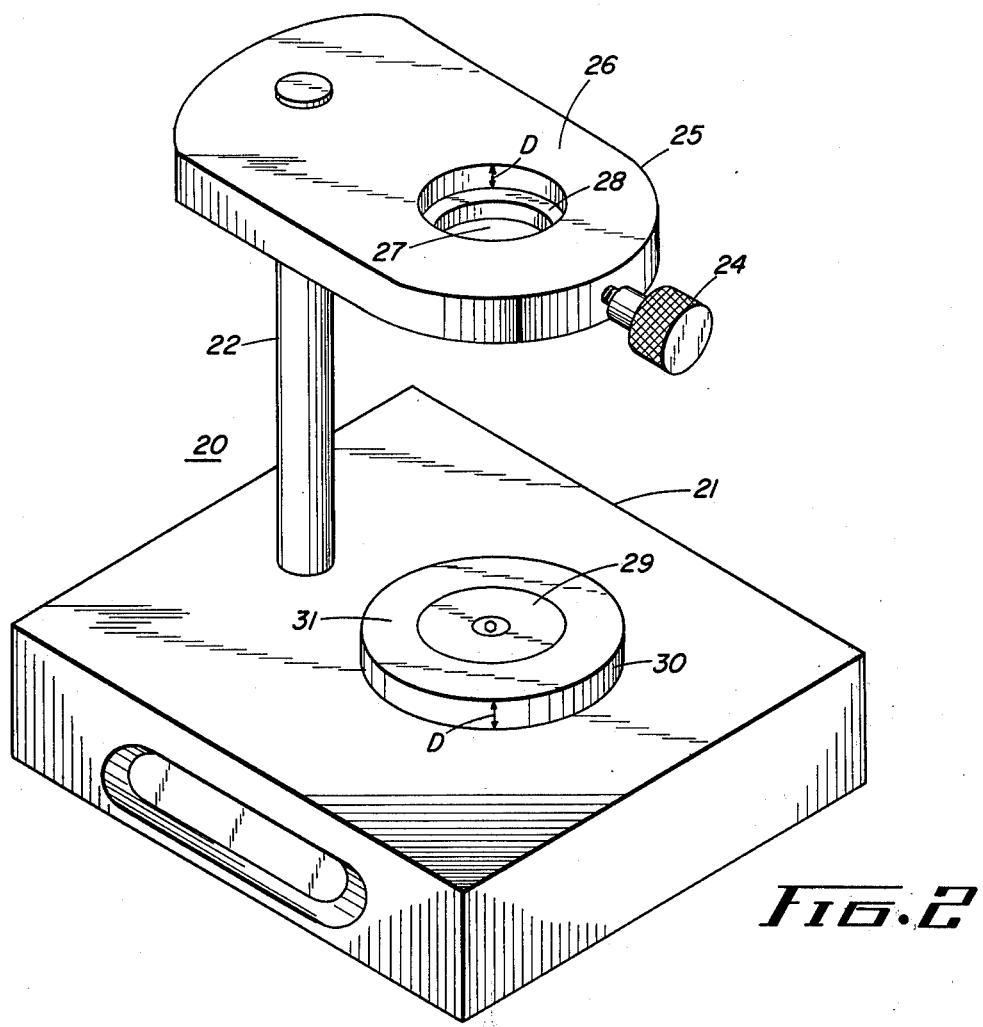
FIG. 2 is an elevational perspective view of a support stand in accordance with the invention.

Referring to FIG. 1, there is shown an apparatus in accordance with the preferred embodiment of the invention. A gripping assembly 100 (shown separately in FIG. 3 and FIG. 6) is removably mounted in an elevated support member 25. The elevated support member 25 is a portion of a support unit 20 which comprises a stand 21, a post 22, and the support member 25 which extends horizontally from the post 22. The support member 25 has a flat top surface 26 which defines a table, and has a circular aperture 27, as seen in FIG. 2. A supporting annular flange 28 extends inwardly from the aperture a predetermined distance, designated D, below the table surface.

Figure 3:
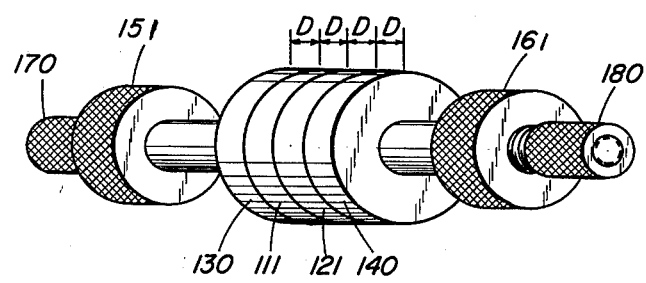
FIG. 3 is a side view of the gripping assembly in accordance with an embodiment of the invention.
Figure 5:
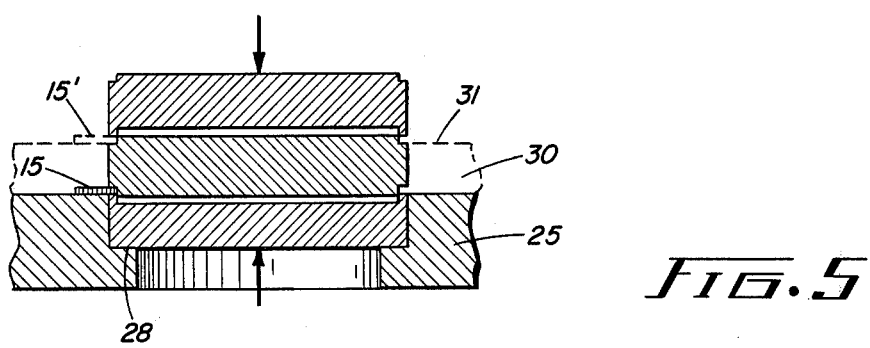
FIG. 5 is a partial cross-sectional view which illustrates operation of the gripping assembly of the invention.

As seen in FIG. 3, the gripping assembly 100 has a cylindrical central region which includes four gripping members designated by the reference numerals 130, 111, 121 and 140. The three interfaces between these four gripping members define slots or gripping vises which are utilized to grip the edges of the electron microscope grid in the manner of a vise. The opening and closing of the slots which define these interfaces is controlled by the knurled members (which have internal threading, as will be described) 170, 151, 161, and 180, in a manner to be described. In the present embodiment, each of the gripping members has a width D which corresponds to the predetermined distance between the top of the supporting annular flange 28 and the table surface 26 of supporting member 25. An auxiliary support member 30 is provided in the shape of a ring and having a top surface 31 which is defined as an auxiliary table surface. The ring 30, when not in use, is conveniently stored on a circular protrusion 29 formed on the stand 21 of unit 20. The auxiliary support member 30 also has a thickness equal to the predetermined distance, D, and is used when the central slot of the gripping assembly 100 is to be "loaded" with electron microscope grids. The auxiliary support member or ring 30 has an inner diameter which conforms to the outer diameter of the gripping members, and the auxiliary support member 30 is shown in use (in dashed line) in the illustration of FIG. 5.

Figure 4:
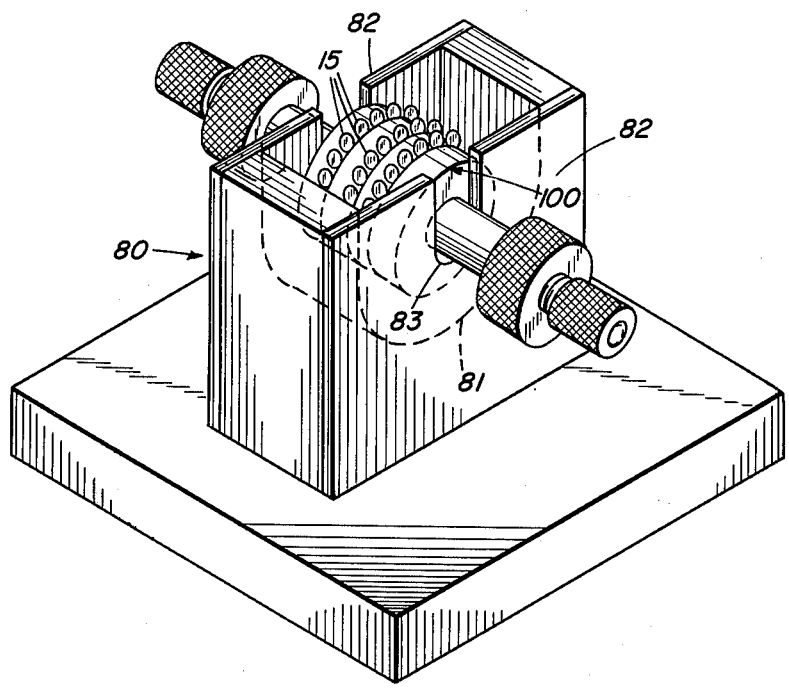
FIG. 4 is an elevational perspective view showing the gripping assembly of the invention in conjunction with a treatment bath.

Briefly, operation of the preferred embodiment of the invention is as follows: the auxiliary support member or ring 30 is initially placed over the aperture 27 of the unit 20, and the gripping assembly 100 is inserted into the auxiliary ring 30 and the aperture 27. The aperture 27, like the ring 30, conforms in shape to the diameter of the gripping members of assembly 100, so the gripping assembly slides readily therein and is retained by the annular flange 28. A manually adjustable set screw 24 in the member is tightened to prevent rotation of the assembly 100. Since the distance from the top of the annular flange to the table surface 26 is D, and the thickness of the auxiliary ring 30 is also D, the middle slot of the gripping assembly 100 is substantially aligned with the auxiliary table surface 31, as seen in dashed line in FIG. 5. In operation, the electron microscope grids, or other chips to be treated, are placed on the auxiliary table surface and the central slot of the gripping assembly 100 is slightly opened (by means to be described). The grids are manually urged into the slot so that their edges are within the slot (see 15' of FIG. 5). The penetration of the grids into the slot is limited by a stop abutment within the gripping members, as will be described further hereinbelow. When all of the grids have been so positioned, the gripping members are tightened together (again, by means to be described). The gripping assembly 100 is then removed from the unit 20 and the auxiliary ring 30 is also removed (and, preferably, stored on the stand 21 of unit 20). The gripping assembly is then reinserted in the aperture 27. Now, one of the slots adjacent an end gripping member will align with the table surface 26. The previously described procedure is then followed, except now the slot which is aligned with the table surface is loaded with grids (e.g. FIG. 1 or the grid 15 of FIG. 5). The gripping assembly 100 is then again removed from the unit 20 and turned over and then reinserted in the aperture 27. The remaining slot is accordingly aligned with the table surface 26, and it is loaded with grids in the manner described. With all three slots loaded with grids (or less than the full three slots, depending upon the number of grids to be treated) treating or staining of the grids can be performed utilizing the bath 80, as shown in FIG. 4. The bath comprises a trough 81 in the shape of a hollow half-cylinder which has a radius that is greater than the radius of the gripping assembly 100 by approximately one grid diameter. The trough is supported at its end by walls 82, and rounded slots 83 are formed in the walls 82 such that the stem extensions of the assembly 100 can rest therein to facilitate manual rotation of the assembly 100 in the bath. The trough 81 contains a suitable treating fluid or stain.

Figure 6:
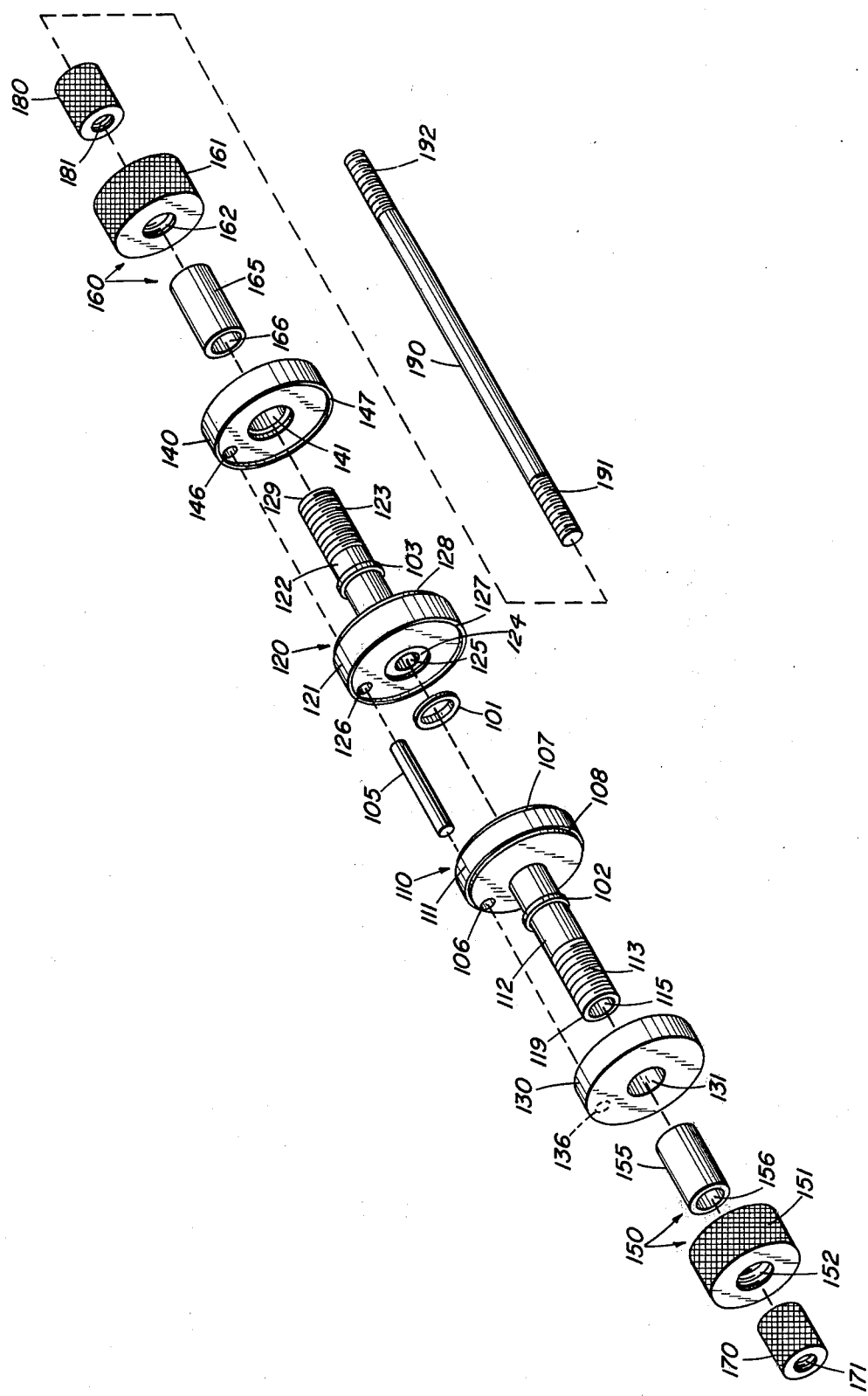
FIG. 6 is an exploded view of the gripping assembly of FIG. 3.

FIG. 6 is useful in understanding the functioning of the gripping assembly 100. The two central gripping members 110 and 120 have generally cylindrical opposing portions 111 and 121, with elongated stems designated by reference numerals 112 and 122, respectively, extending outwardly therefrom. The stems 112 and 122 have external threading, as shown at 113 and 123. The members 110 and 120 have central bores which pass through their stems, as shown at 115 and 125. A rubber grommet 101 serves as a resilient spacer between members 110 and 120 and is seated in a groove 124 in the member 120.

Generally cylindrical gripping members 130 and 140 have central bores which are proportioned to slidably fit over the stem 112 and 122, respectively. Rubber O-rings 102 and 103 are disposed on the stems 112 and 122, respectively. Threaded actuating means 150 comprises a tubular spacer 155 which fits over the stem 112 and an actuating nut 151 which has internal threading and is knurled on its exterior surface. Similarly, actuating means 160 comprises a tubular spacer 165 which fits over the stem 122 and an actuating nut 161 which has internal threading and is knurled on its exterior surface. The actuating spacers 155 and 165 are proportioned to provide a sliding fit over the stems 112 and 122, and the internal threading of the actuating nuts 151 and 161 engages the threading 113 and 123 of the stem 112 and 122, respectively. Accordingly, it is seen that by tightening the nut 151, the spacer 155 squeezes the gripping member 130 against the cylindrical portion 111 of gripping member 110. Similarly, tightening the nut 161 forces the spacer 165 to squeeze the gripping member 140 against the cylindrical portion 121 of gripping member 120. Thus it is seen that control over the two outer gripping slots is effected by the nuts 151 and 161.

Control over the central slot (i.e., the interface between cylindrical portions 111 and 121) is achieved by a central shaft 190 which passes through the gripping members 110 and 120, and actuating nuts 170 and 180 which have internal threading at 171 and 181 that engages threading 191 and 192, respectively, on the shaft 190. In operation, when one of the nuts 170 or 180 is tightened on the shaft 190, the inner edges of the nuts 170 and 180 engage the outer edges 119 and 129, respectively, of the stems 112 and 122, thereby constituting an axial force which presses the members 110 and 120 together.

As indicated above, the gripping members have stop abutments, as shown, for example, at 108, 107 and 128 in FIG. 6. The surfaces which oppose the stop abutments each have an annular rim which defines a shallow recess that receives the stop abutment, such as is shown at 127 and 147. The gripping members also have small bores therein, as shown at 136, 106, 126 and 146 which receive a pin 105 that prevents any relative rotation of the gripping members.

We claim:
1. Apparatus for gripping and holding a plurality of relatively small flat chips by the edges thereof, comprising, in combination:
   an elevated support member having a top surface which defines a table, said member having an aperture therein;
   a support flange extending inwardly from said aperture a predetermined distance below said table surface; and
   a gripping assembly removably mountable in the aperture in said support member, said assembly including:
   a first gripping member having a periphery corresponding to the contour of said aperture and having a thickness at its periphery which corresponds to said predetermined distance;
   a second gripping member having a periphery at least a portion of which has a contour that corresponds to the periphery of said first gripping member;
   resilient spacer means disposed between said first and second gripping members and being operative to normally bias the peripheries of said gripping members slightly apart; and
   means fo temporarily squeezing said gripping members together;
   whereby when said gripping assembly is mounted in said support member and seated on said flange, chips placed on the table surface can be manually moved to positions where their edges are between the spaced peripheries of said gripping members, whereupon activation of said squeezing means causes gripping and holding of the chip edges by said gripping assembly.

2. Apparatus as defined by claim 1 wherein at least one of said gripping members has a stop abutment spaced from the edges thereof to define a maximum penetration of the chips between said gripping members, and the other of said gripping members has a recess proportioned to receive the stop abutment.

3. Apparatus as defined by claim 1 wherein said gripping members are cylindrical in shape and have central bores therethrough, and wherein said means for temporarily squeezing said gripping members together comprises a central shaft through said bores, said shaft having threading thereon, and threaded nut means which engage said shaft and can be tightened thereon to squeeze said gripping members together.

4. Apparatus as defined by claim 2 wherein said gripping members are cylindrical in shape and have central bores therethrough, and wherein said means for temporarily squeezing said gripping members together comprises a central shaft through said bores, said shaft having threading thereon, and threaded nut means which engage said shaft and can be tightened thereon to squeeze said gripping members together.

5. Apparatus for gripping and holding a plurality of relatively small flat chips by the edges thereof, comprising, in combination:
   an elevated support member having a top surface which defines a table, said member having a circular aperture therein;
   an annular support flange extending inwardly from said aperture a predetermined distance below said table surface;
   an auxliary support member mountable over said elevated support member and having a circular aperture which conforms to the aperture of said elevated support member, a top surface defining an auxiliary table, and a thickness which corresponds to said predetermined distance;
   a gripping assembly removably mountable in said elevated support member or the combination of said support member and said auxiliary support member, said assembly including:
   first and second generally cylindrical gripping members having opposing end surfaces, the other end surfaces of each of said gripping members having an elongated threaded central stem extending therefrom, each of said first and second gripping members having a central bore which passes through its stem;
   third and fourth generally cylindrical gripping members, each having a thickness which corresponds to said predetermined distance, said third and fourth gripping members having central bores which are proportioned to fit over the stems of said first and second gripping members, respectively, so that said third and fourth members can be slidably mounted over said stems, the interfaces between the peripheries of said first and second members, said first and third members, and said second and fourth members, defining first, second, and third gripping vises, respectively;
   resilient spacer means disposed between said first and second, said first and third, and said second and fourth members, respectively;
   an elongated threaded central shaft which extends through the bores in said first and second gripping members and protrudes from the stems thereof;
   first and second threaded means engaging the stems of said first and second gripping members, respectively, and being manually adjustable to temporarily squeeze the third and fourth gripping members, respectively, against the first and second gripping members; and
   third threaded means mounted on said shaft and manually adjustable to temporarily force the stems of said first and second gripping members together so as to temporarily squeeze the first and second gripping members together.

* * * * *